(12) United States Patent
Yu et al.

(10) Patent No.: US 10,700,009 B2
(45) Date of Patent: Jun. 30, 2020

(54) RUTHENIUM METAL FEATURE FILL FOR INTERCONNECTS

(71) Applicant: Tokyo Electron Limited, Minato-ku, Tokyo (JP)

(72) Inventors: Kai-Hung Yu, Watervliet, NY (US); Nicholas Joy, Mechanicville, NY (US); Eric Chih Fang Liu, Guilderland, NY (US); David L. O'Meara, Albany, NY (US); David Rosenthal, Fishkill, NY (US); Masanobu Igeta, Hillsboro, OR (US); Cory Wajda, Sand Lake, NY (US); Gerrit J. Leusink, Rexford, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/147,928

(22) Filed: Oct. 1, 2018

(65) Prior Publication Data

US 2019/0103363 A1    Apr. 4, 2019

Related U.S. Application Data

(60) Provisional application No. 62/568,218, filed on Oct. 4, 2017.

(51) Int. Cl.

| H01L 21/283 | (2006.01) |
| H01L 23/532 | (2006.01) |
| H01L 21/285 | (2006.01) |
| H01L 21/3213 | (2006.01) |
| H01L 21/768 | (2006.01) |

(Continued)

(52) U.S. Cl.
CPC ...... *H01L 23/53252* (2013.01); *C23C 16/045* (2013.01); *C23C 16/16* (2013.01); *C23C 16/45553* (2013.01); *C23C 16/56* (2013.01); *H01L 21/28568* (2013.01); *H01L 21/32136* (2013.01); *H01L 21/76876* (2013.01); *H01L 21/76882* (2013.01); *H01L 21/3212* (2013.01);
(Continued)

(58) Field of Classification Search
None
See application file for complete search history.

(56) References Cited

U.S. PATENT DOCUMENTS

| 7,901,545 B2 | 3/2011 | Cerio et al. |
| 2004/0089891 A1 | 5/2004 | Anma et al. |

(Continued)

FOREIGN PATENT DOCUMENTS

| JP | 2004165405 A | 6/2004 |
| JP | 2010212601 A | 9/2010 |

OTHER PUBLICATIONS

Korean Intellectual Property Office, The International Search Report and the Written Opinion for International application No. PCT/US2018/053675, dated Feb. 1, 2019, 14 pp.

*Primary Examiner* — Bradley Smith

(57) ABSTRACT

A method is provided for void-free Ru metal filling of features in a substrate. The method includes providing a substrate containing features, depositing a Ru metal layer in the features, removing the Ru metal layer from a field area around an opening of the features, and depositing additional Ru metal in the features, where the additional Ru metal is deposited in the features at a higher rate than on the field area. According to one embodiment, the additional Ru metal is deposited until the features are fully filled with Ru metal.

20 Claims, 3 Drawing Sheets

(51) Int. Cl.
    *C23C 16/16*     (2006.01)
    *C23C 16/56*     (2006.01)
    *C23C 16/455*    (2006.01)
    *C23C 16/04*     (2006.01)
    *H01L 23/522*    (2006.01)
    *H01L 21/321*    (2006.01)

(52) U.S. Cl.
    CPC ...... *H01L 21/7684* (2013.01); *H01L 23/5226* (2013.01); *H01L 23/53257* (2013.01)

(56) References Cited

U.S. PATENT DOCUMENTS

2011/0159690 A1*  6/2011  Chandrashekar ........................... H01L 21/28556
                                                                    438/675
2012/0064471 A1   3/2012  Takara et al.
2012/0064717 A1   3/2012  Kato et al.
2016/0358815 A1* 12/2016  Yu ....................... H01L 23/5226

* cited by examiner

RUTHENIUM METAL FEATURE FILL FOR INTERCONNECTS

CROSS-REFERENCE TO RELATED APPLICATIONS

This application is related to and claims priority to U.S. Provisional Patent Application Ser. No. 62/568,218 filed on Oct. 4, 2017, the entire contents of which are herein incorporated by reference.

FIELD OF THE INVENTION

The present invention relates to methods for void-free filling of features such as vias and trenches for microelectronic devices with low resistivity ruthenium (Ru) metal.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal and interlayer dielectric layers that insulate the metal layers from each other.

Normally, each metal layer must form an electrical contact to at least one additional metal layer. Such electrical contact is achieved by etching a feature (i.e., a via) in the interlayer dielectric that separates the metal layers, and filling the resulting via with a metal to create an interconnect. Metal layers typically occupy etched pathways in the interlayer dielectric. A "via" normally refers to any feature such as a hole, line or other similar feature formed within a dielectric layer that provides an electrical connection through the dielectric layer to a conductive layer underlying the dielectric layer. Similarly, metal layers connecting two or more vias are normally referred to as trenches.

The use of copper (Cu) metal in multilayer metallization schemes for manufacturing integrated circuits creates problems due to high mobility of Cu atoms in dielectrics, such as $SiO_2$, and Cu atoms may create electrical defects in Si. Thus, Cu metal layers, Cu filled trenches, and Cu filled vias are normally encapsulated with a barrier material to prevent Cu atoms from diffusing into the dielectrics and Si. Barrier layers are normally deposited on trench and via sidewalls and bottoms prior to Cu seed deposition, and may include materials that are preferably non-reactive and immiscible in Cu, provide good adhesion to the dielectrics and can offer low electrical resistivity.

An increase in device performance is normally accompanied by a decrease in device area or an increase in device density. An increase in device density requires a decrease in via dimensions used to form interconnects, including a larger aspect ratio (i.e., depth to width ratio). As via dimensions decrease and aspect ratios increase, it becomes increasingly more challenging to form diffusion barrier layers with adequate thickness on the sidewalls of the vias, while also providing enough volume for the metal layer in the via. In addition, as via and trench dimensions decrease and the thicknesses of the layers in the vias and trenches decrease, the material properties of the layers and the layer interfaces become increasingly more important. In particular, the processes forming those layers need to be carefully integrated into a manufacturing process sequence where good control is maintained for all the steps of the process sequence.

The problems associated with the use of Cu metal in increasingly smaller features in a substrate will require replacing the Cu metal with other low-resistivity metals. New methods for void-free metal filling of these increasingly smaller features is required.

SUMMARY OF THE INVENTION

A method is provided for Ru metal filling of features in a substrate. The method includes providing a substrate containing features, depositing a Ru metal layer in the features, removing the Ru metal layer from a field area around an opening of the features, and depositing additional Ru metal in the features, where the additional Ru metal is deposited in the features at a higher rate than on the field area. According to one embodiment, the additional Ru metal is deposited until the features are fully filled with Ru metal.

According another embodiment, the method includes providing a substrate containing features, depositing a Ru metal layer in the features, where depositing the Ru metal layer pinches off the feature openings before the features is filled with the Ru metal layer, thereby forming a void inside the feature. The method further includes removing excess Ru metal that caused the pinch-off, where the removing removes the Ru metal layer from a field area around an opening of the features, and depositing additional Ru metal in the feature, where the additional Ru metal is deposited in the features at a higher rate than on the field area. According to one embodiment, the additional Ru metal is deposited until the features are fully filled with Ru metal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Methods for void-free filling of features with low resistivity Ru metal for microelectronic devices are described in several embodiments. It has been shown that Ru metal, with its short effective electron mean free path, is an excellent candidate to meet International Technology Roadmap for Semiconductors (ITRS) resistance requirements as a Cu metal replacement at about 10 nm (5 nm node) minimum feature sizes. Due to many material and electrical properties of Ru metal, it is less affected by downward scaling of feature sizes than Cu metal.

According to one embodiment, a method is provided for Ru metal filling of features in a substrate or features in a film on a substrate. The method includes providing a substrate containing features, depositing a Ru metal layer in the features, removing the Ru metal layer from a field area around an opening of the features, and depositing additional Ru metal in the features, where the additional Ru metal is deposited in the feature at a higher rate than on the field area.

According to another embodiment, the method includes providing a substrate containing features, depositing a Ru metal layer in the features, where depositing the Ru metal layer pinches off feature openings before the features are filled with the Ru metal layer, thereby forming a void inside the features. The method further includes removing excess Ru metal that caused the pinch-off, where the removing removes the Ru metal layer from a field area around an opening of the features, and depositing additional Ru metal in the features, where the additional Ru metal is deposited in the features at a higher rate than on the field area.

Embodiments of the invention may be applied to a variety of recessed features of different physical shapes found in semiconductor devices, including square features with vertical sidewalls, bowed features with convex sidewalls, and features with a sidewall having an area of retrograde profile relative to a direction extending from a top of the feature to the bottom of the features. The features can, for example, include a trench or a via. A feature diameter can be less than 30 nm, less than 20 nm, less than 10 nm, or less than 5 nm. A feature diameter can be between 20 nm and 30 nm, between 10 nm and 20 nm, between 5 nm and 10 nm, or between 3 nm and 5 nm. A depth of the features can, for example be greater 20 nm, greater than 50 nm, greater than 100 nm, or greater than 200 nm. The features can, for example, have an aspect ratio (AR, depth:width) between 2:1 and 20:1, between 2:1 and 10:1, or between 2:1 and 5:1. In one example, the substrate (e.g., Si) includes a dielectric layer and the feature is formed in the dielectric layer.

Figure 1A:
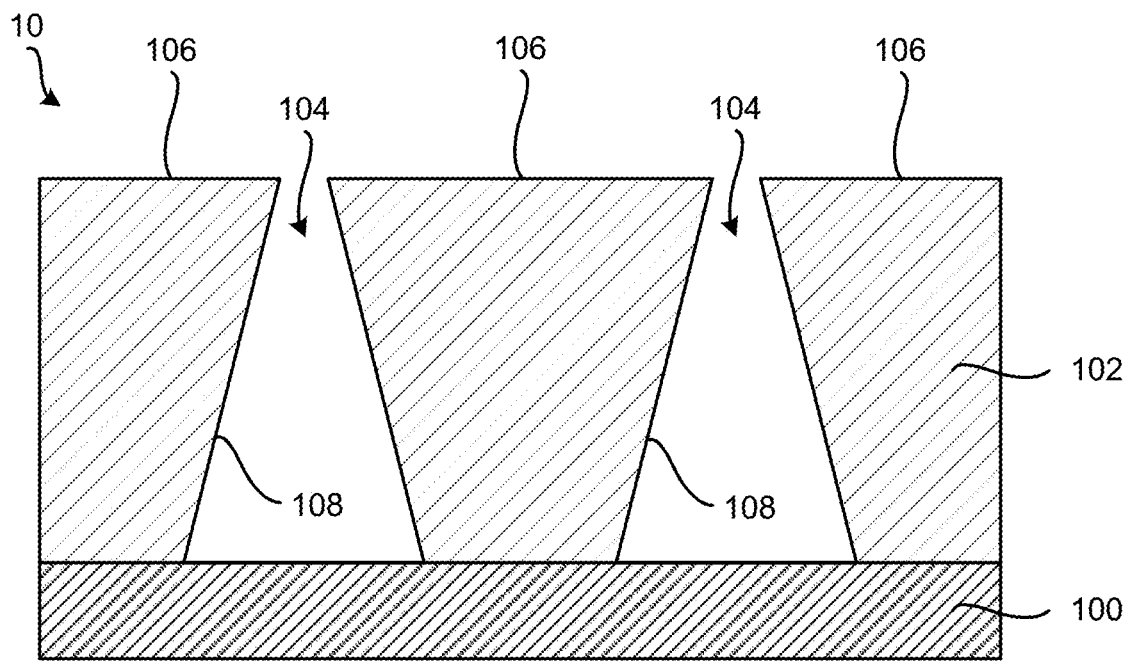
FIGS. 1A-1D schematically show cross-sectional Ru metal filling of features according to an embodiment of the invention.

FIGS. 1A-1D schematically show cross-sectional Ru metal filling of features according to an embodiment of the invention. In FIG. 1A, the substrate 10 contains features 104 in a film 102, where the features 104 include a sidewall 108 having an area of retrograde profile relative to a direction extending from a top of the features 104 to the bottom of the features 104 above a film 100. The substrate 10 further contains a field area 106 near the openings of the features 104. According to one embodiment, the films 100 and 102 may contain the same material. For example, the material may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. According to another embodiment, the films 100 and 102 may contain different materials. The different materials may be selected from the group consisting of silicon, germanium, silicon germanium, a dielectric material, a metal, and a metal-containing material. The dielectric material may be selected from the group consisting of $SiO_2$, SiON, SiN, a high-k material, a low-k material, and an ultra-low-k material.

Figure 1B:
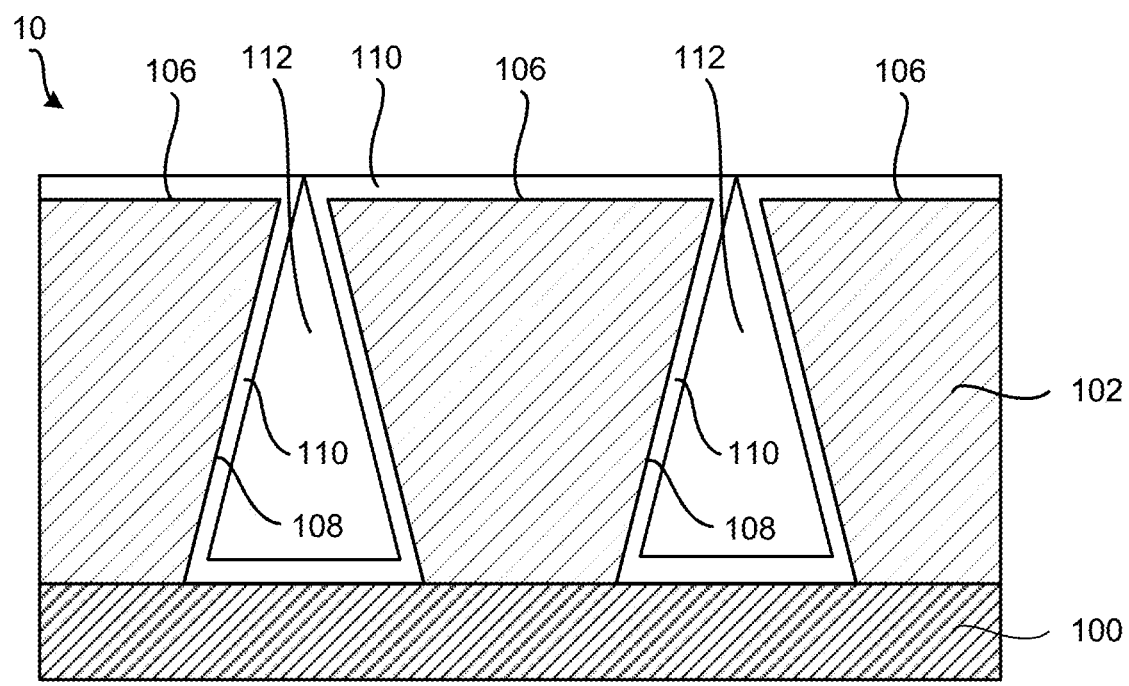

FIG. 1B show a conformal Ru metal layer 110 deposited with a substantially uniform thickness on the substrate 10, including on the field area 106 and in the features 104. The conformal Ru metal layer 110 pinches off the feature openings before the features 104 are filled with the Ru metal, thereby blocking further Ru metal deposition in the features 104 and forming voids (keyholes) 112 inside the features 104. The Ru metal layer 110 consists of pure Ru metal or substantially pure Ru metal containing a small amount of impurities (e.g., carbon and oxygen). The Ru metal layer 110 may be deposited by atomic layer deposition (ALD), chemical vapor deposition (CVD), plating, or sputtering. In one example, the Ru metal layer may be deposited by CVD using $Ru_3(CO)_{12}$ and CO carrier gas at a substrate temperature of about 200° C. However, other Ru metal precursors may be used by CVD to deposit the Ru metal layer 110.

Although not depicted in FIG. 1B, a nucleation layer may be deposited on the substrate 10, including in the features 104, by ALD or CVD prior to the Ru metal deposition. According to one embodiment, the nucleation layer may be selected from the group consisting of Mo, MoN, Ta, TaN, TaAlN, W, WN, Ti, TiN, and TiAlN. A role of the nucleation layer is to provide a good nucleation surface and an adhesion surface in the features 104 to ensure conformal deposition of the Ru metal layer 110 with a short incubation time. Unlike when using a Cu metal fill, a good diffusion barrier layer is not required between the dielectric material and the Ru metal in the features. Therefore, in the case of a Ru metal fill, the nucleation layer can be very thin and may be non-continuous or incomplete with gaps that expose a dielectric material in the features. This allows for increasing the amount of Ru metal in a feature fill compared to a Cu metal feature fill. In some examples, a thickness of the nucleation layer can be 20 Å or less, 15 Å or less, 10 Å or less, or 5 Å or less. In one example, a TaN nucleation layer may be deposited using atomic layer deposition (ALD) with alternating exposures of tert-butylimido-tris-ethylmethylamido-tantalum (TBTEMT, $Ta(NCMe_3)(NEtMe)_3$) and ammonia ($NH_3$) at a substrate temperature of about 350° C.

Figure 1C:
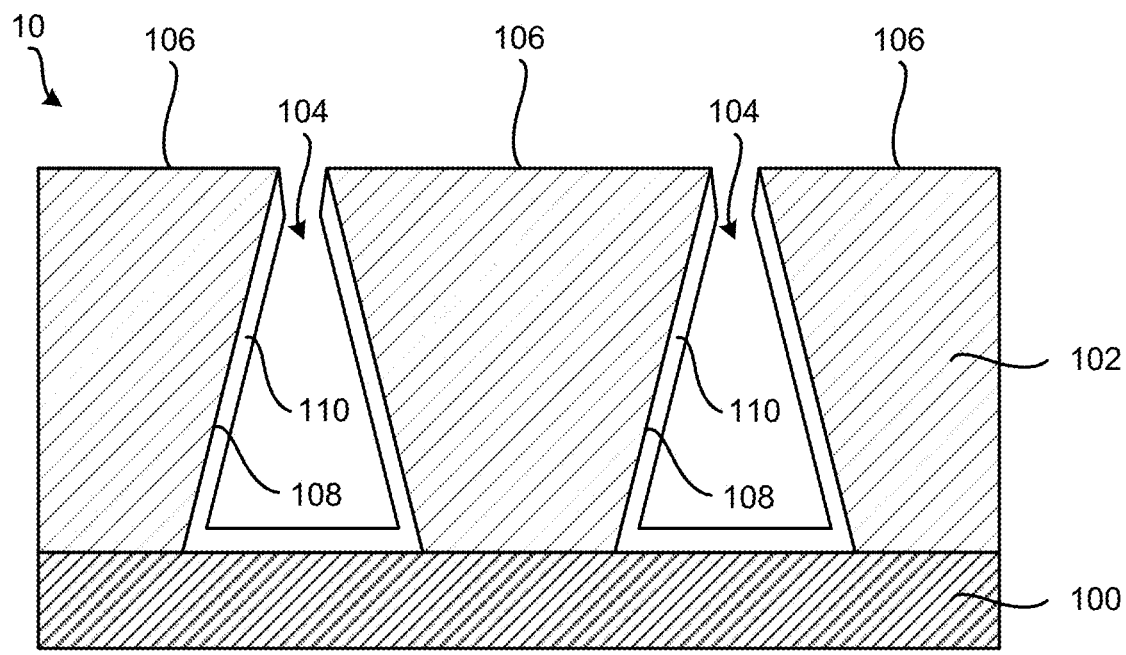

FIG. 1C shows the substrate 10 following removal of the Ru metal layer 110 from the field area 106 around the openings of the features 104 and removal of the Ru metal layer 110 that caused the pinch-off of the feature openings. According to one embodiment, the removal of the Ru metal layer 110 can include exposing the substrate 10 to a plasma-excited dry etching process. The plasma-excited dry etching process can include a chemical reaction between a plasma-excited etching gas and the Ru metal layer 110, physical removal of the Ru metal layer 110 by a non-reactive gas, or a combination thereof. In one example, the plasma-excited dry etching process includes exposing the substrate 10 to a plasma-excited etching gas containing an oxygen-containing gas and optionally a halogen-containing gas. In another example, the removing can include sputter removal or redistribution of the Ru metal layer 110 using a plasma-excited Ar gas. According to another embodiment, the removal of the Ru metal layer 110 may include a chemical mechanical polishing (CMP) process. According to another embodiment, the removal of the Ru metal layer 110 can include heat-treating the Ru metal layer 110 to reflow the Ru metal layer 110 in the features 104. According to yet another embodiment, the removal of the Ru metal layer 110 can include a combination of a plasma-excited dry etching process and heat-treating. Exemplary processing conditions for a plasma-excited dry etching process include a gas pressure between about 5 mTorr and about 760 mTorr, substrate temperature between about 40° C. about 370° C. A capacitively coupled plasma (CCP) processing system containing a top electrode plate and a bottom electrode plate supporting a substrate may be used. In one example, radio frequency (RF) power between about 100 W and about 1500 W may be applied to the top electrode plate. RF power may also be applied to the bottom electrode plate to increase Ru metal removal.

According to one embodiment, the plasma excited etching gas can contain an oxygen-containing gas and optionally a halogen-containing gas to enhance the Ru metal removal. The oxygen-containing gas can include $O_2$, $H_2O$, CO, $CO_2$, and a combination thereof. The halogen-containing gas can, for example, include $Cl_2$, $BCl_3$, $CF_4$, and a combination thereof. In one example, the plasma excited etching gas can include $O_2$ and $Cl_2$. The plasma excited etching gas can further include Ar gas. In another example, the plasma excited etching gas can consist of $O_2$ gas and optionally Ar gas. In some embodiments, one or more of the gases in the plasma excited etching gas may be cycled.

Figure 1D:
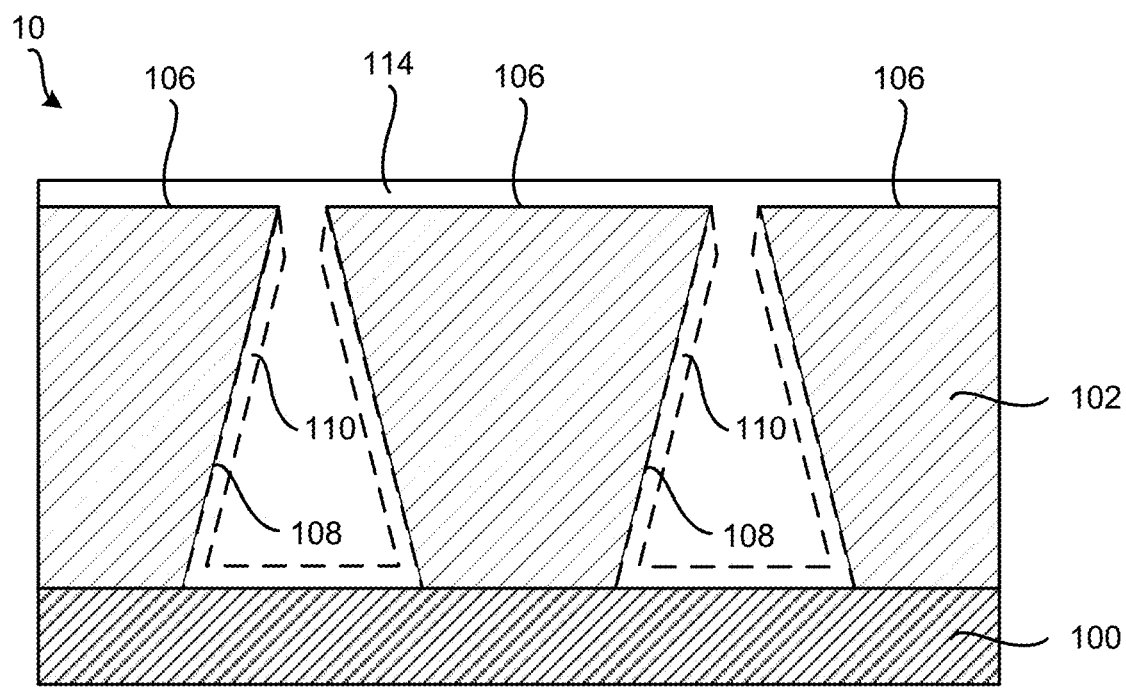

FIG. 1D shows the substrate 10 following depositing of additional Ru metal 114 in the features 104 that results in void-free Ru metal filling of the features 104. The inventors have discovered that the additional Ru metal 114 is deposited on the Ru metal layer 110 in the features 104 at a higher rate than on the field area 106 of the film 102, thereby enabling complete Ru metal filling of the features 104 and preventing pinch-off of the feature openings before the features 104 are filled with the additional Ru metal 114. Together, the Ru metal layer 110 and the additional Ru metal 114 fully fill the features 104 with Ru metal, with excess Ru metal present on the field area 106. According to some embodiments, the steps of Ru metal deposition and the Ru metal removal may be repeated at least once if needed to provide void-free Ru metal filling of the features 104.

According to an embodiment of the invention, following the Ru metal filling, the substrate 10 may be heat-treated in order to minimize impurities in the Ru metal and to increase Ru metal grain size. This results in lowering the electrical resistance of the Ru metal. According to another embodiment, following the removal of the Ru metal layer 110 from the field area 106 around the openings of the features 104, the substrate may be heat-treated in order to minimize impurities in the Ru metal and provide improved Ru metal deposition selectivity in the features 104 relative to on the field area 106. The heat-treating may be performed at a substrate temperature between 200° C. and 600° C., between 300° C. and 400° C., between 500° C. and 600° C., between 400° C. and 450° C., or between 450° C. and 500° C. Further, the heat-treating may be performed at below atmospheric pressure in the presence of Ar gas, $H_2$ gas, or both Ar gas and $H_2$ gas. In one example, the heat-treating may be performed at below atmospheric pressure in the presence of forming gas. Forming gas is a mixture of $H_2$ and $N_2$. In another example, the heat-treating may be performed under high-vacuum conditions without flowing a gas into a process chamber used for the heat-treating.

Figure 2A:
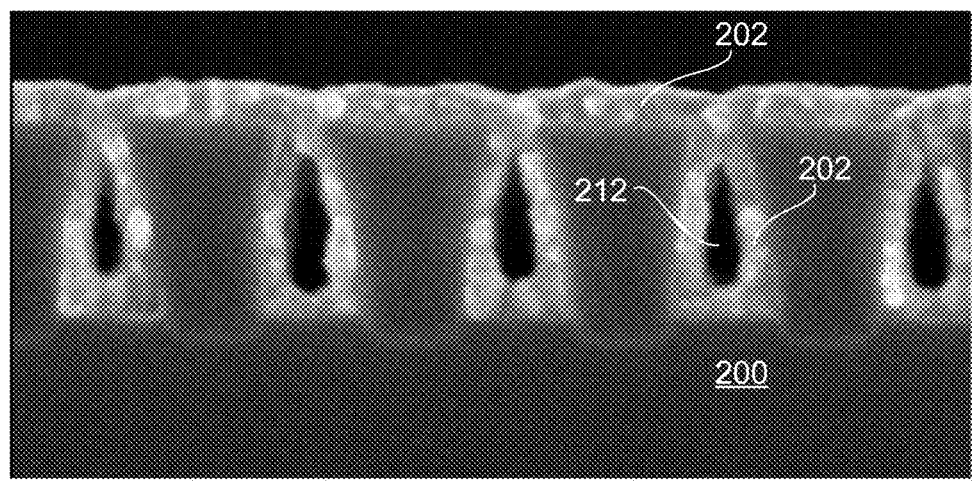
FIGS. 2A-2C show cross-sectional scanning electron microscopy (SEM) images of Ru metal filling of features according to an embodiment of the invention.
Figure 2B:
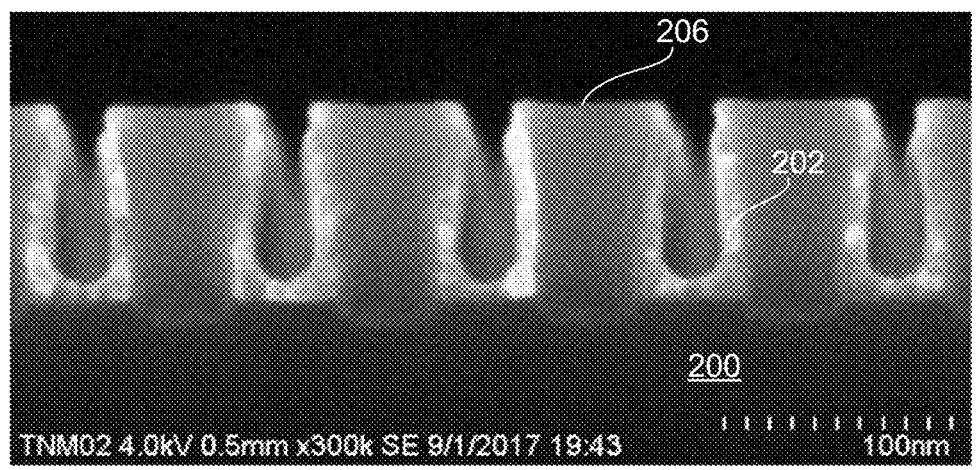
Figure 2C:
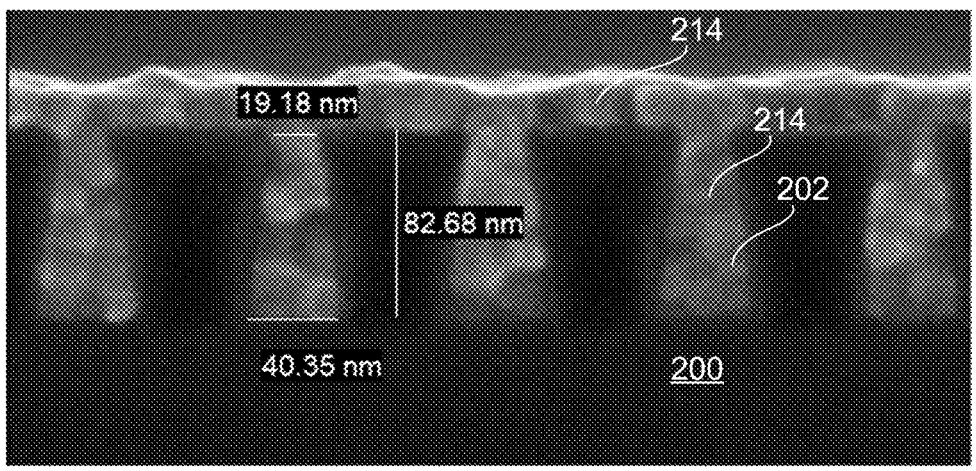

FIGS. 2A-2C show cross-sectional SEM images of Ru metal filling of features according to an embodiment of the invention. FIG. 2A shows a conformal Ru metal layer 202 deposited on a substrate containing features etched in a film 200. The features had an opening diameter of about 19 nm, a bottom diameter of about 40 nm, and a height of about 83 nm. The conformal Ru metal layer 202 was deposited by CVD using $Ru_3(CO)_{12}$ and CO carrier gas at a substrate temperature of about 200° C. The conformal Ru metal layer 202 layer in FIG. 2A pinched-off the feature openings before the features were filled with Ru metal, thereby forming voids 212 inside the features. FIG. 2B shows the substrate following removal of the conformal Ru metal layer 202 from the field area 206 around the openings of the features and removal of a portion of the Ru metal layer 202 that caused the pinch-off of the feature openings. The Ru metal removal was performed using a plasma-excited dry etching process that included exposing the substrate to a plasma-excited etching gas containing an $O_2$ gas, $Cl_2$ gas, and Ar gas. FIG. 2C shows the substrate following deposition of additional Ru metal 214 in the features that results in void-free Ru metal filling of the features. The additional Ru metal 214 was deposited in the features at a higher rate than on the field area 206, thereby enabling the complete Ru metal filling of the features and preventing pinching-off the feature openings before features were filled with the Ru metal.

Methods for void-free filling of features such as vias and trenches with low resistivity Ru metal for microelectronic devices have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for ruthenium (Ru) metal filling, the method comprising:
   providing a substrate containing features having a sidewall and a bottom, the sidewall including an area of retrograde profile relative to a direction extending from a top of the features to the bottom of the features;
   depositing a Ru metal layer in the features,
   removing the Ru metal layer from a field area around an opening of the features; and
   depositing additional Ru metal in the features, wherein the additional Ru metal is deposited in the features at a higher rate than on the field area.

2. The method of claim 1, wherein the additional Ru metal is deposited until the features are fully filled with Ru metal.

3. The method of claim 1, wherein the removing includes exposing the substrate to a plasma-excited dry etching process.

4. The method of claim 3, wherein the plasma-excited dry etching process includes exposing the substrate to a plasma-excited etching gas containing an oxygen-containing gas and optionally a halogen-containing gas.

5. The method of claim 3, wherein the plasma-excited dry etching process includes exposing the substrate to a plasma-excited etching gas containing an oxygen-containing gas and a halogen-containing gas, the oxygen-containing gas containing $O_2$, $H_2O$, CO, $CO_2$, or a combination thereof, and the halogen-containing gas containing $Cl_2$, $BCl_3$, $CF_4$, or a combination thereof.

6. The method of claim 1, further comprising:
   prior to depositing the Ru metal layer, forming a nucleation layer in the features, wherein the nucleation layer is selected from the group consisting of Mo, MoN, Ta, TaN, TaAlN, W, WN, Ti, TiN, and TiAlN.

7. The method of claim 1, wherein the Ru metal layer and the additional Ru metal are deposited by atomic layer deposition (ALD) or chemical vapor deposition (CVD).

8. The method of claim 7, wherein the Ru metal layer is conformally deposited by CVD using $Ru_3(CO)_{12}$ and CO carrier gas.

9. The method of claim 1, further comprising heat-treating the substrate to reflow the Ru metal layer in the features.

10. The method of claim 9, wherein the heat-treating is performed at a substrate temperature between 200° C. and 600° C.

11. A method for ruthenium (Ru) metal filling, the method comprising:
    providing a substrate containing features having a sidewall and a bottom, the sidewall including an area of retrograde profile relative to a direction extending from a top of the features to the bottom of the features;
    depositing a Ru metal layer in the features, wherein depositing the Ru metal layer pinches off the feature openings before the features are filled with the Ru metal layer, thereby forming voids inside the features;
    removing excess Ru metal that caused the pinch-off, wherein the removing removes the Ru metal layer from a field area around an opening of the features; and
    depositing additional Ru metal in the features, wherein the additional Ru metal is deposited in the features at a higher rate than on the field area.

12. The method of claim 11, wherein the additional Ru metal is deposited until the features are fully filled with Ru metal.

13. The method of claim 11, wherein the removing includes exposing the substrate to a plasma-excited dry etching process.

14. The method of claim 13, wherein the plasma-excited dry etching process includes exposing the substrate to a plasma-excited etching gas containing an oxygen-containing gas and optionally a halogen-containing gas.

15. The method of claim 11, further comprising:
    prior to depositing the Ru metal layer, forming a nucleation layer in the feature, wherein the nucleation layer is selected from the group consisting of Mo, MoN, Ta, TaN, TaAlN, W, WN, Ti, TiN, and TiAlN.

16. The method of claim 11, wherein the Ru metal layer and the additional Ru metal are deposited by atomic layer deposition (ALD) or chemical vapor deposition (CVD).

17. The method of claim 16, wherein the Ru metal layer is conformally deposited by CVD using $Ru_3(CO)_{12}$ and CO carrier gas.

18. The method of claim 11, further comprising heat-treating the substrate to reflow the Ru metal layer in the feature.

19. The method of claim 18, wherein the heat-treating is performed at a substrate temperature between 200° C. and 600° C.

20. A method for ruthenium (Ru) metal filling, the method comprising:
    providing a substrate containing features;
    depositing a Ru metal layer in the features;
    removing the Ru metal layer from a field area around an opening of the features, wherein the removing includes exposing the substrate to a plasma-excited dry etching process that includes exposing the substrate to a plasma-excited etching gas containing an oxygen-containing gas and optionally a halogen-containing gas; and
    depositing additional Ru metal in the features, wherein the additional Ru metal is deposited in the features at a higher rate than on the field area.

* * * * *